United States Patent [19]
Savignac et al.

[11] Patent Number: 5,457,655
[45] Date of Patent: Oct. 10, 1995

[54] COLUMN REDUNDANCE CIRCUIT CONFIGURATION FOR A MEMORY

[75] Inventors: Dominique Savignac, Ismaning; Jürgen Weidenhoefer; Diether Sommer, both of Munich, all of Germany

[73] Assignee: Siemens Aktiengesellschaft, Munich, Germany

[21] Appl. No.: 198,502

[22] Filed: Feb. 17, 1994

[30] Foreign Application Priority Data

Feb. 19, 1993 [EP] European Pat. Off. ............ 93102667

[51] Int. Cl.$^6$ ..................................... G11C 7/00
[52] U.S. Cl. ................. 365/200; 365/225.7; 371/10.3
[58] Field of Search ..................... 365/200, 230.03, 365/227, 225.7; 371/10.2, 10.3

[56] References Cited

U.S. PATENT DOCUMENTS 5,227,997  7/1993  Kikuda et al. ........................ 365/200

FOREIGN PATENT DOCUMENTS 0472209  2/1992  European Pat. Off. .
0492099  7/1992  European Pat. Off. .
0529330  3/1993  European Pat. Off. .

OTHER PUBLICATIONS

IEEE Journal of Solid–State Circuits, vol. 26, No. 1, Jan. 1991, pp. 12–17, (Horiguchi et al.), "A Flexible Redundancy Technique for High–Density DRAM's".

Primary Examiner—Joseph A. Popek
Attorney, Agent, or Firm—Herbert L. Lerner; Laurence A. Greenberg

[57] ABSTRACT

A column redundance circuit configuration for a memory includes a memory blocks with memory cells disposed in x lines and y columns. Redundant memory cells are disposed in b lines and c columns. A column decoder and c redundant column decoders are provided. Each column decoder is assigned to a respective one of the c redundant columns of each of the memory blocks. D encoding elements each have an address decoding device for assigning it to an arbitrary memory block.

10 Claims, 9 Drawing Sheets

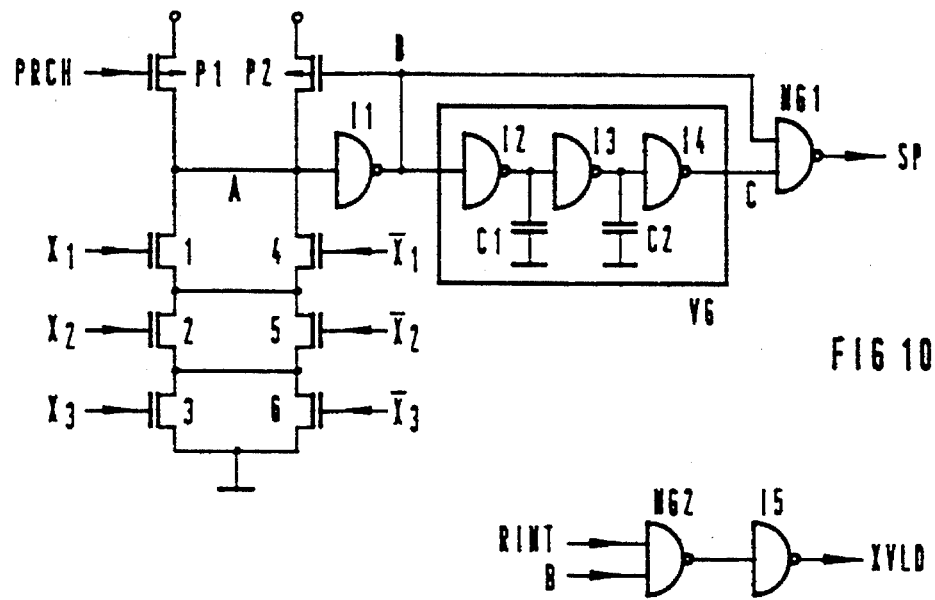
FIG 10
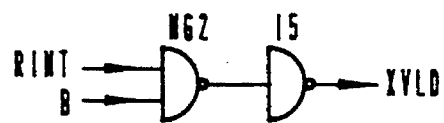
FIG 11
FIG 12
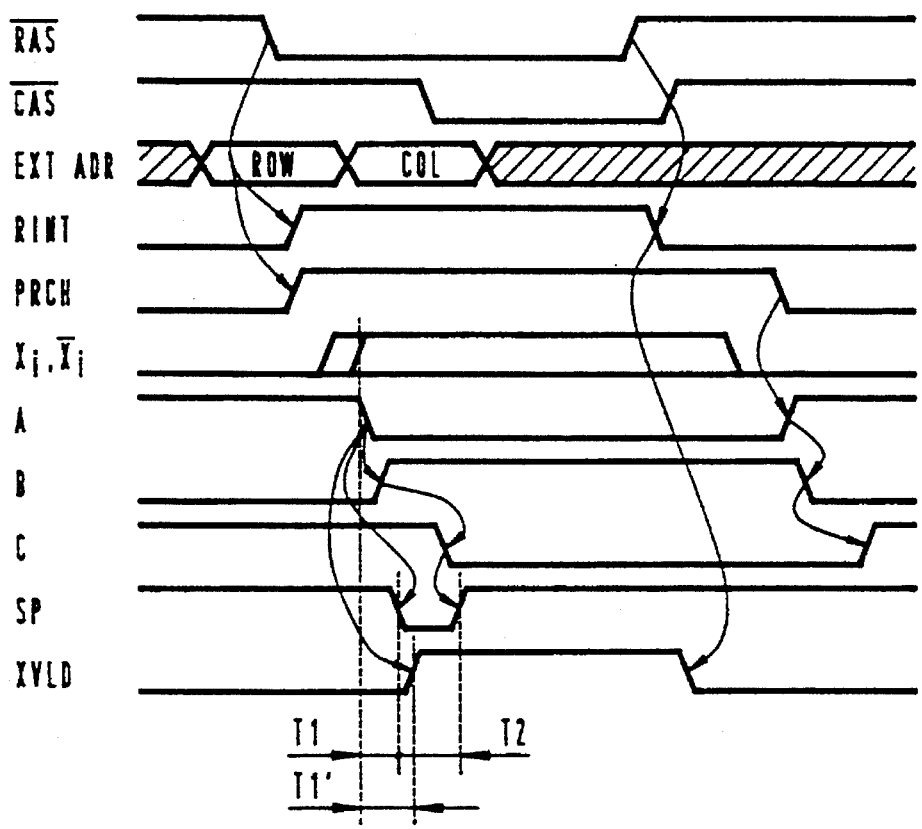

COLUMN REDUNDANCE CIRCUIT CONFIGURATION FOR A MEMORY

BACKGROUND OF THE INVENTION

FIELD OF THE INVENTION

The invention relates to a column redundance circuit configuration for a memory having a memory blocks with memory cells disposed in x lines and y columns, redundant memory cells being disposed in b lines and c columns, a column decoder, c redundant column decoders, each column decoder being assigned to a respective one of the c redundant columns of each memory block, and d encoding elements.

One such configuration is described in IEEE Journal of Solid State Circuits, Vol. 26, No. 1, January 1991, pp. 12 ff., for example.

The reduction in raster dimensions with each new memory generation increases the vulnerability to defects in the cell field. Cost-effective production therefore requires devices on the memory with which such defects can be repaired. As a rule, supplementary cells are provided, which are used instead of the defective cells by means of programmable encoding elements.

In larger-capacity memories, the memory cells are subdivided into a plurality of blocks. Due to the matrix-like configuration of the memory cells, the supplementary cells must also be disposed in rows and columns. Such redundant lines are generally formed at the edge of the cell fields. They are each selected by a programmable element in connection with the addresses being applied.

The programmable elements may be laser-separable fuse blocks, for instance. Typically, each fuse block has one or more redundant lines fixedly assigned to it. If the repair capability is to be increased, then the number of redundant lines must be increased, and therefore the number of fuse blocks as well. The space required for that kind of increase in redundance is substantial and can lead to a reduction of the number of pieces per wafer. In present memory generations, the surface area required for the fuse blocks together with their trigger circuits is approximately as large as the surface area occupied by the redundant memory cells. On one hand, statistics for redundance utilization, for instance in a 4 MB memory, show that on average only half of the fuse blocks are employed for repair. On the other hand, defect analysis has shown that doubling the redundance makes an up to 20% higher yield possible. That shows that in the structure of redundance architecture up to now, a substantial proportion of memories cannot be repaired, even though in principle enough programmable encoding elements are available.

If the repair capability is to be increased even further, then it would be advantageous for reasons of space if only the number of redundant lines had to be increased, and if better utilization of existing fuse blocks could be achieved by suitable switching.

If column redundance is expanded, the increase in power consumption represents a further problem. In contrast to triggering the row redundance, which is used only at the beginning of a cycle, triggering of the column redundance must be operationally ready over the entire active cycle. Since triggering circuits with dynamic logic and quadrature-axis current components have previously been used therefor, expanding the column redundance at the same time also means increasing the power consumption.

SUMMARY OF THE INVENTION

It is accordingly an object of the invention to provide a column redundance circuit configuration for a memory, which overcomes the hereinafore-mentioned disadvantages of the heretofore-known devices of this general type, which enables improved utilization of the existing fuse blocks while increasing the column redundance and which enables reducing the power consumption.

With the foregoing and other objects in view there is provided, in accordance with the invention, a column redundance circuit configuration for a memory, comprising a memory blocks with memory cells disposed in x lines and y columns; redundant memory cells being disposed in b lines and c columns; a column decoder; c redundant column decoders; each column decoder being assigned to a respective one of the c redundant columns of each of the memory blocks; and d encoding elements, each of the d encoding elements having address decoding means for assigning it to an arbitrary memory block.

In accordance with another feature of the invention, the number d of the encoding elements is less than the product of the number a of the memory blocks and the number of the redundant column decoders.

In accordance with a further feature of the invention, there is provided a NOR gate with c inputs and an output, the column decoder having an activating input, the encoding elements being subdivided into c groups and having outputs, the inputs of the NOR gate being connected to the outputs of the encoding elements, and the output of the NOR gate being connected to the activating input of the column decoder.

In accordance with an added feature of the invention, one of the memory blocks includes a number of individual memory blocks, and all of the individual memory blocks have redundant column lines for simultaneously replacing various column lines to be replaced.

In accordance with an additional feature of the invention, the address decoding means contain separate means for decoding a memory block address and a column address.

In accordance with yet another feature of the invention, the means for decoding the memory block address are connected in series with the means for decoding the column address.

In accordance with yet a further feature of the invention, the means for decoding the memory block address and the column address have a number of parallel-connected series circuits of separable fuse elements and field effect transistors having load paths being connected between a node point and ground and having control inputs receiving address signals, a holding stage having an input terminal being connected to the node point and having an output terminal for issuing a first decoding signal, and an activating stage, having an output signal being imposed upon the node point.

In accordance with yet an added feature of the invention, the activating stage contains first and second field effect transistors of a first conduction type and one field effect transistor of a second conduction type having load paths being connected in series between a supply potential and ground, the field effect transistor of the second conduction type being connected to ground and having a control terminal, the first field effect transistor of the first conduction type being connected to the supply potential and having a control terminal being connected to the control terminal of the field effect transistor of the second conduction type and being supplied with a first control signal, the second field effect transistor of the first conduction type having a control terminal receiving a further control signal, and the series circuit of the load paths of the second field effect transistor of the first conduction type and of the field effect transistor of the second conduction type being connected at a node point at which an output signal can be picked up.

In accordance with yet an additional feature of the invention, the address decoding means are constructed as a dynamic circuit configuration.

In accordance with a concomitant feature of the invention, the means for decoding the memory block address and the column address have a number of parallel-connected series circuits of separable fuse elements, field effect transistors having load paths being connected between a node point and ground, the field effect transistors having control inputs receiving address signals, a precharging transistor having a load path being connected between a supply voltage terminal and the node point, a dynamic holding stage being connected to the node point, and a logic gate having an input terminal being connected to the node point and an output terminal at which the output signal of the decoding means can be picked up.

Other features which are considered as characteristic for the invention are set forth in the appended claims.

Although the invention is illustrated and described herein as embodied in a column redundance circuit configuration for a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 10 is a schematic circuit diagram of a configuration for generating a setting pulse SP of FIG. 6;

FIG. 11 is a schematic circuit diagram of a configuration for generating a signal XVLD of FIG. 8; and FIG. 12 is a timing diagram for explaining the function of the circuit of FIG. 10.

DESCRIPTION OF THE PREFERRED EMBODIMENTS

Figure 1:
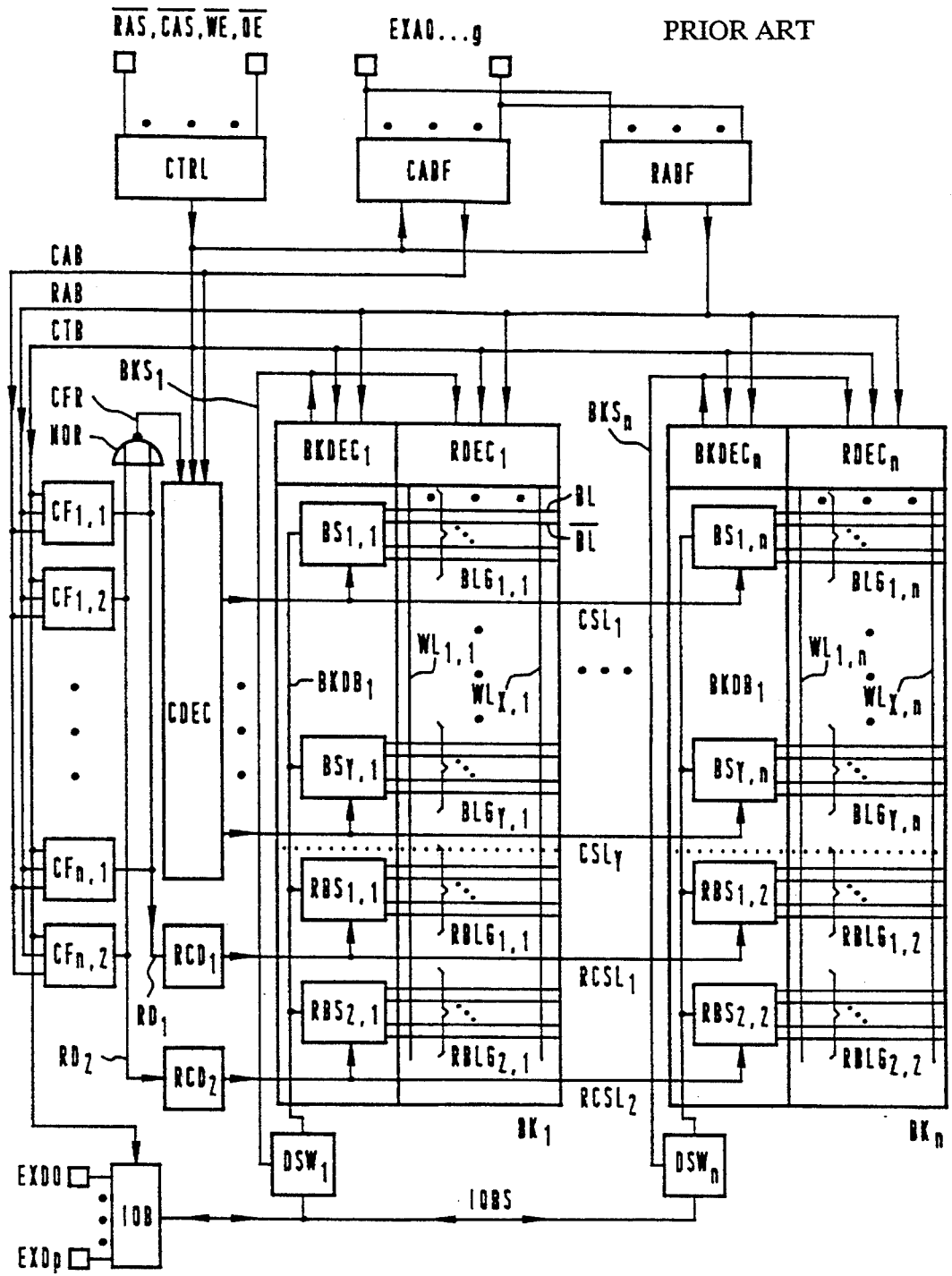
FIG. 1 is a simplified block circuit diagram of a memory with column redundance in accordance with the prior art.

Referring now to the figures of the drawing in detail and first, particularly, to FIG. 1 thereof, there is seen a simplified block circuit diagram of a memory with column redundance, in accordance with the prior art. Encoding units for redundant columns are fixedly assigned to the blocks. FIG. 1 shows a control unit CTRL, which processes externally applied control pulses, RAS (Row-Address Strobe), CAS (Column-Address-Strobe), WE (Write Enable) and optionally 0E (Output Enable). In the control unit CTRL, the usual internal control pulses are generated, which are schematically combined in a control bus CTB in the drawing. A row address buffer unit RABF is also shown, which derives internal row addresses EAB from external addresses EXA0 . . . q, under the control of control lines from the unit CTRL. A column address buffer unit CABF is also shown, which generates internal column addresses CAB from the control unit CTRL, from the external addresses EXA0 . . . q, together with the control lines. An input/output unit IOB is provided, which provides for the data transfer into and out of the memory. External data lines EXD0 . . . p are connected to it.

Those units form the standard peripheral of the memory and will therefore not be described in further detail. The function of various control lines will be explained only in later segments, as is needed for understanding individual circuits.

Also shown in FIG. 1 is a group of N memory blocks $BK_1 \ldots N$, where N is a multiple of 2, $N=2^m$, for example, and two of the memory blocks $BK_1$ and $BK_n$ are shown in FIG. 1. A column decoder CDEC that is common to all of the blocks $BK_n$ (n=1. . . N) is also shown, and without general limitation, two redundant column decoders $RCD_1$ and $RCD_2$ which are common to all of the blocks $BK_{1 \ldots N}$ are also shown. Finally, two groups each of N encoding elements $CF_{1 \ldots N, 1 \ldots 2}$ for the address encoding and column redundance, which will be described below, are shown.

The use of the common column decoders CDEC is usual in higher-capacity memories, for the sake of space. Except for the first four peripherals, of which there is only one each in the memory, the other components may naturally be laid out multiply in parallel. FIG. 1 shows a single group of memory blocks $BK_{1 \ldots N}$ merely for the sake of simplicity.

A memory block $BK_n$ includes a cell field with a familiar matrix-like configuration of memory cells, word lines $WL_{1,n} \ldots WL_{x,n}$ and pairs of bit lines $BLG_{1,n} \ldots BLG_{y,n}$, where by way of example a "folded bit line" configuration BL, BL of a block decoder BKDEC and a word decoder/driver $RDEC_{1 \ldots n}$, as well as bit amplifiers/switches $BS_{1,n} BS_{y,n}$, and finally data bit amplifiers/switches $DSW_{1 \ldots n}$ ($1 \leq n \leq N$), is shown therein.

In the illustration shown, only a single memory block at a time is activated by its associated block decoder $BKDEC_n$. For that purpose, a first portion of the row addresses RAB is delivered to the block decoders $BKDEC_n$. The addresses are so numerous that a 1 out of N selection may be made. The block selection line $BKS_n$ of a selected block decoder $BKDEC_n$ activates the associated word decoder/driver $RDEC_n$ and the data bit amplifier/switch $DSW_n$. The word lines of a memory block $BK_n$ are selected by the active word decoder/driver $RDEC_n$, to which the second portion of row addresses is delivered for that purpose. Redundant word lines are not shown in that case.

The signals of the bit line pairs $BLG_{y,n}$ are amplified by the activated bit amplifier $DSW_n$ and switched in groups by means of the bit switches $BS_{y,n}$ to the block data bus $BKDB_n$ of the corresponding width. The bit switches are each driven by an active bit group selection line $CSL_{1 \ldots Y}$ from the common column decoder CDEC. The bit group selection lines $CSL_{1 \ldots Y}$ are selected by the column decoder CDEC, to which a first portion of the column addresses is delivered for that purpose. The other portion of the addresses is used for the data decoding in the input/output buffer 10B. In the example shown in FIG. 1, Y bit group selection lines are present, where $2^k=Y$. That is, K column addresses are available for decoding the Y selection lines. The selection lines have an effect only in the active block. The column decoder CDEC additionally has a control input CFR. If this signal is inactive, that is if it is logical "0" in positive logic, for instance, all of the selection lines are deactivated.

The data on the block data bus $BKDB_n$ are amplified in a reading cycle and are switched to the input/output bus IOBS through the data bit switches of $DSW_n$.

This bus 10BS connects the data bit switches $DSW_n$ with the input/output buffer 10B. Conversely, in a writing cycle the data from the input/output bus IOBS are written on the block data bus $BKDB_n$ through the switches and stored in the various cells through the bit switches $BS_{y,n}$ being selected.

In each memory block of FIG. 1, two redundant bit line groups $RBLG_{1,1 \ldots 2,2}$ with their associated bit amplifiers/switches $RBS_{1,1 \ldots 2,2}$ are additionally shown. The bit switch groups are each activated by a redundant selection line $RCSL_1$ and $RCSL_2$, respectively, from the redundant drivers $RCD_1$ and $RCD_2$, respectively, that are common to all of the memory blocks $BK_n$. The function of a redundant unit is identical to that of the normal unit.

Finally, FIG. 1 also shows two groups of N encoding elements each, that is $CF_{1 \ldots N, 1 \ldots 2}$, or in other words one element per memory block $BK_{nT}$ and per redundant selection line $RCSL_1$ and $RCSL_2$, respectively. The encoding elements $CF_n, 1 \ldots 2$ receive the first part of the row addresses RAB, which is responsible for the 1 out of N block decoding, and the same column addresses CAB as the column decoder CDEC, as the input. Their outputs are switched to two separate lines, $CF_{1 \ldots N,1}$ to $RD_1$, and $CF_{1 \ldots N,2}$ to $RD_2$. The lines are delivered to the inputs of the redundant drivers $RCD_1$ and $RCD_2$ and to a NOR gate. An output of the NOR gate forms an input CFR of the column decoder.

In each cycle, one memory block $BK_n$ is activated through the corresponding block decoder $BKDEC_n$. With the same row address combination, the two associated encoding elements $CF_{n,1}$ and $CF_{n,2}$ are also selected. In the normal case, the lines $RD_1$ and $RD_2$ are inactive, or are at logical "0".

Accordingly, redundant failure lines $RCSL_1$ and $RCSL_2$ are also inactive and the control signal CFR, then logical "1", enables the column decoder CDEC. A failure line $CSL_i$ corresponding to the column addresses CAB is accordingly selected and switches a normal bit line group $BLG_{y,n}$ to the block data bus $BKDB_n$ of the active memory block $BK_n$.

If an addressed memory cell of the bit line group $BLG_{y,n}$ within the memory block $BK_n$ being selected is defective, then one of the two encoding elements $CF_{n,1}$ or $CF_{n,2}$ is programmed for the corresponding column address. When that address appears, the line $RD_1$ or $RD_2$ is activated. In the example shown in that case, they are logical "1". Accordingly, the control signal CFR becomes inactive, or in other words logical "0" and blocks the column decoder CDEC The selection line $CSL_y$ being selected in the normal case as a result remains inactive. Instead, the redundant line $RCSL_1$ or $RCSL_2$ becomes logical "1". As a result, the memory cells of the bit line group $RBLG_1$ or $RBLG_2$ are addressed, instead of those of the normal unit. With the column redundancy structure shown, it is accordingly possible for two different bit line groups with defective cells per memory block to be replaced with redundant groups.

Figure 2:
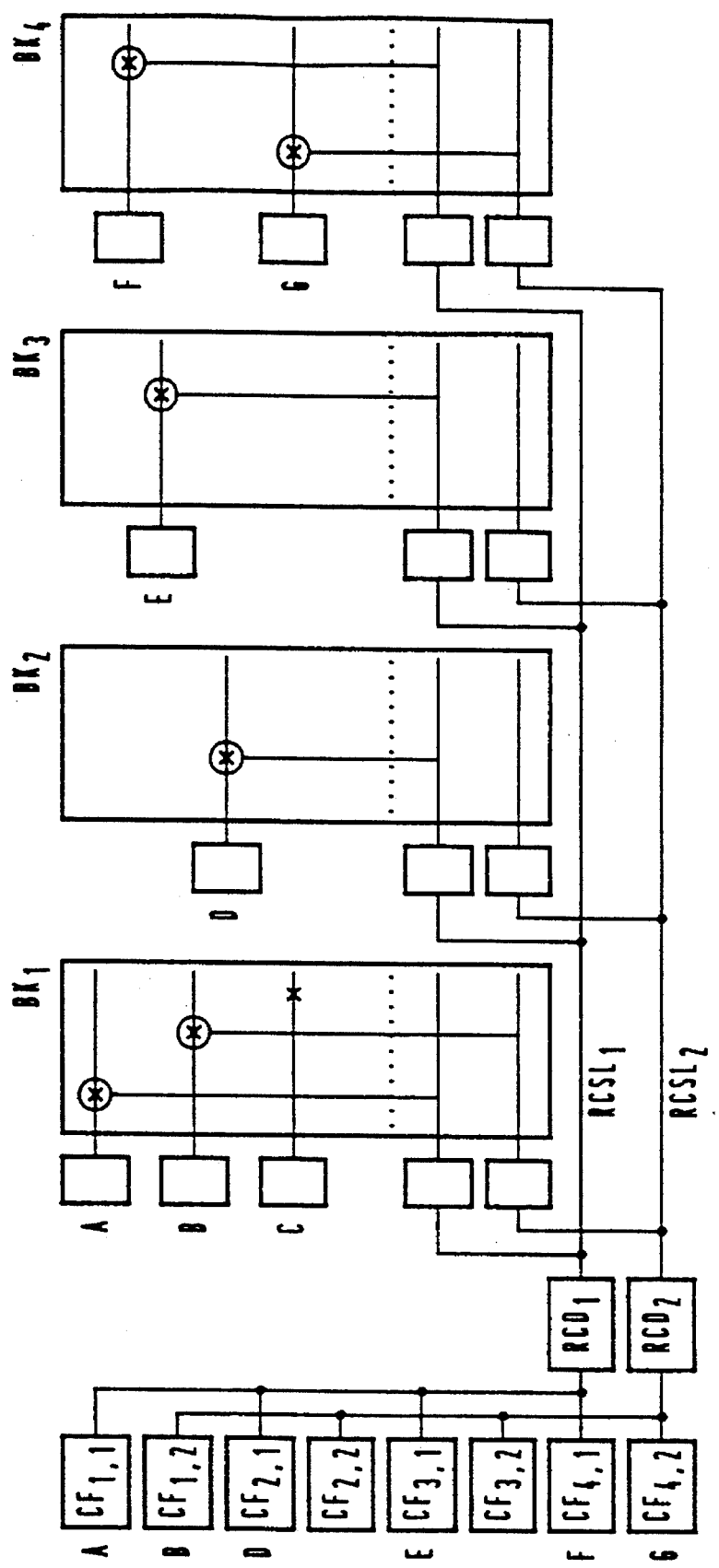
FIG. 2 is a block circuit diagram which shows a simplified example of repair in the case of fixed-block column redundance.

FIG. 2 shows a repair example with fixed-block column redundance in accordance with FIG. 1, for the case where N=4, with there being two redundant bit line groups per block and where six errors occur. The defective units are marked with the letters A–G. In the first block, three errors appear at A, B, C; in the second and third blocks, one error each at D and E, respectively, appear, and in the last block, two errors F and G appear. The left-hand side of FIG. 2 shows the utilization of the encoding elements CF1,1 . . . CF4,2. Since only two defective units at a time can be repaired per memory block BK1 . . . 4, it is clear that in this example the memory cannot be repaired, even though two unused decoding elements are left over, since only six of the available eight encoding elements $CF_{1,1 \ldots 4,2}$ can be used. Defective places in the memory blocks BK1 . . . 4 are marked with an X. The defective units replaced by redundant bit line groups are marked with a circle.

Figure 3:
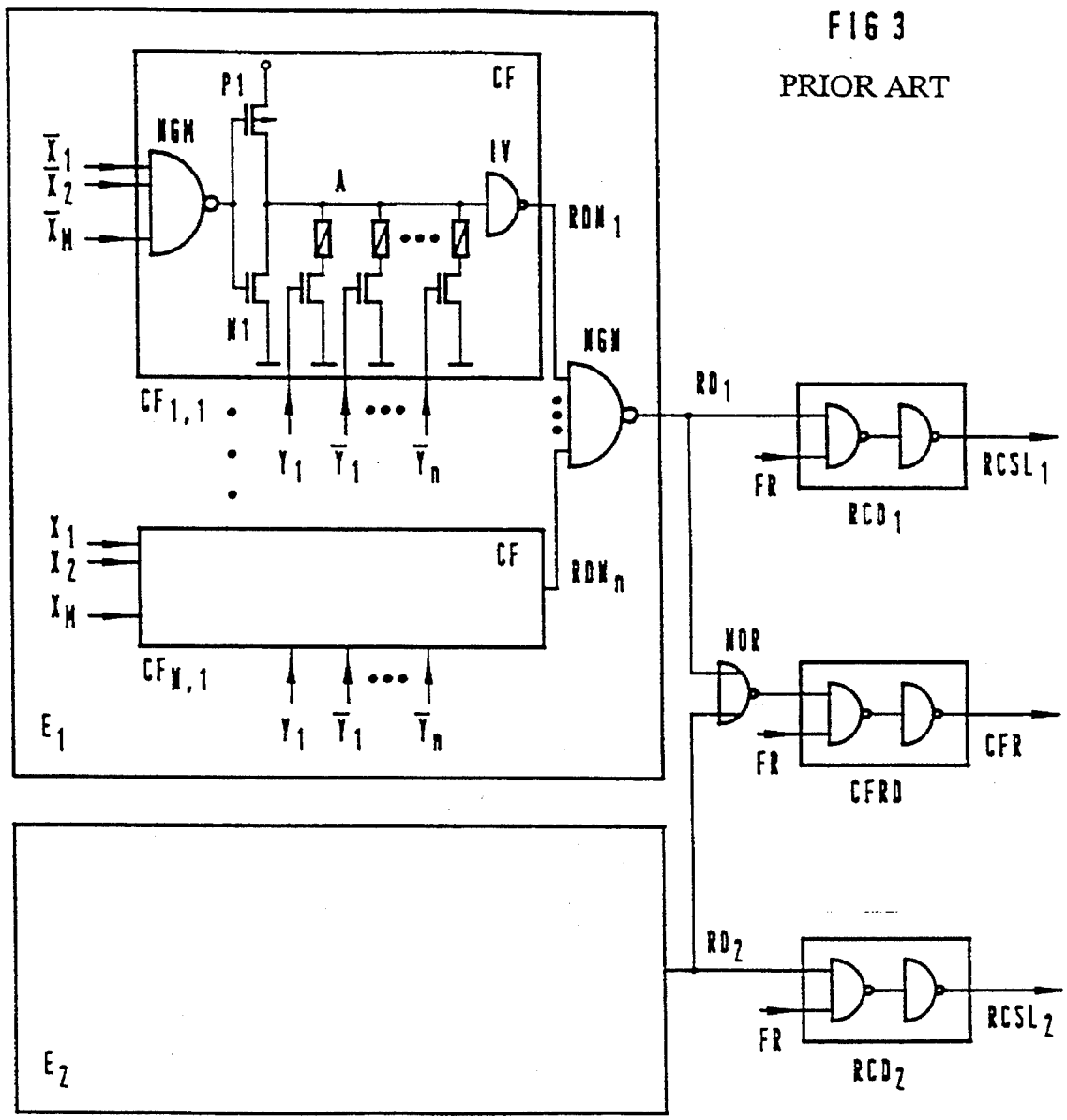
FIG. 3 is a schematic circuit diagram of a configuration for fuse blocks, and triggering thereof with fixed-block column redundance, in accordance with the prior art.

So-called fuse blocks are typically used as the encoding elements. FIG. 3 shows a typical circuit of the prior art for encoding the column addresses with fixed-block column redundance, for the case where laser-separable fuse blocks are used as encoding elements in the circuit configuration of FIG. 1. The two aforementioned groups of encoding elements are identical in structure and are shown as respective units $E_1$ and $E_2$, with only one shown in detail. Such a unit $E_1$ includes N identical circuits $CF_{1 \ldots N,1}$ for $E_1$ and $CF_{1 \ldots N,2}$ for $E_2$, and one NAND gate NGN with N inputs $RDN_{1 \ldots N}$ and one output $RD_1$ for $E_1$ and $RD_2$ for $E_2$. The output signals $RD_1$ and $RD_2$ are each delivered to a respective redundant driver $RCD_1$ and $RCD_2$ having the outputs $RCSL_1$ and $RCSL_2$ and to the NOR gate already shown in FIG. 2. An output of this NOR gate is connected to a driver CFRD having an output which is the signal CFR. The three drivers include a NAND gate and a following inverter. Second inputs of the NAND gates are connected to an enable signal FR, which in a logical "0" state keeps both the normal and the redundant selection lines at low potential, logical "0". This enable signal FR is typically used for synchronizing purposes.

Each circuit $CF_{i,j}$ also has M inputs for block encoding, where $N=2^M$, $2 \times K$ inputs for column encoding where $Y=2^k$, and one output $RDN_i$, which is connected to one input of the NAND gate NGN.

Such a circuit $CF_{i,j}$ includes a NAND gate NGN with M inputs, a following inverter P1, N1, $2 \times K$ n-channel transistors, each being in series with one fuse element, which is connected parallel at an output A of the inverter P1, N1; and one output inverter IV. The block selection is made through the input NAND gate NGN, to which one of all of the possible combinations of M lines from the M block address lines $X_{1 \ldots M}$ and their complementary lines $\bar{X}_{1 \ldots M}$, for instance, is delivered. A circuit $CF_{i,j}$ is activated whenever all of the inputs of this NAND gate are logical "1". Its output is then logical "0" and the output A of the inverter P1, N1 is accordingly logical "1". In all of the other circuits CF, at least one input $X_m$ or $\bar{X}_m$ is logical "0". Accordingly the inverter outputs A are also logical "0" and the lines $RDN_n$ are logical "1".

If $Y=2^k$ selection lines $CSL_1 \ldots _y$, then $2 \times K$ column address lines are needed to encode one column address, without a general limitation, such as $Y_1 \ldots _K$ or $\bar{Y}_1 \ldots _K$, because the series circuit of an n-channel transistor and a laser-separable fuse element exhibits an effect only when there is an input signal having a state of logical "1".

If in the activated circuit $CF_{i,j}$ at least one fuse element, in which the corresponding column address line has the state of logical "1" is not separated, then the node A is kept at such a low potential through this turned-on n-channel transistor that the output inverter IV switches to logical "1". In that case, all of the lines $RDN_1 \ldots _N$ accordingly have the state of logical "0", and the output line RDJ of NGN has the state of logical "0". The associated redundant selection line $RCSL_j$ is accordingly inactive, that is logical "0", regardless of the signal FR. If this is true for both lines $RD_1$ and $RD_2$, then both redundant lines $RCSL_1$ and $RCS_2$ are inactive and the output of the NOR gate is logical "1". If the enable signal FR becomes active, "1", the signal CFR likewise assumes the state of logical "1" and unlocks the column decoder. In that case, a normal bit line group will be selected.

If in contrast in an active circuit $CF_{i,1}$ or $CF_{i,2}$ all of the fuse elements in which the corresponding column address lines are logical "1" have been separated, then the node A remains charged to high potential and the output inverter IV remains in the state of logical "0". Accordingly a line $RD_1$ or $RD_2$ assumes the state of logical "1". The output of the NOR gate is accordingly logical "0". This is equally applicable to the signal CFR, regardless of the enable signal FR, so that the column decoder is locked. Conversely, the redundant selection line $RCSL_1$ or $RCSL_2$ is activated, and the corresponding redundant bit line group in the active memory block $BK_i$ is selected.

One disadvantage of the version described is that when a nonprogrammed column address is applied, that is in Y−1 cases of Y, a quadrature-axis current component flows across the transistor P1 of the selected circuit $CF_{i,j}$ toward the low potential during the entire active cycle. This quadrature-axis current component may appear twice in each memory block group $E_1, E_2$, and in specific versions with a plurality of such groups assumes an impermissibly high value. A further disadvantage, again in specific cases, is the overly high number of lines $RDN_1 \ldots _N$ and the resultant necessarily unfavorably large output gate NGN.

Figure 4:
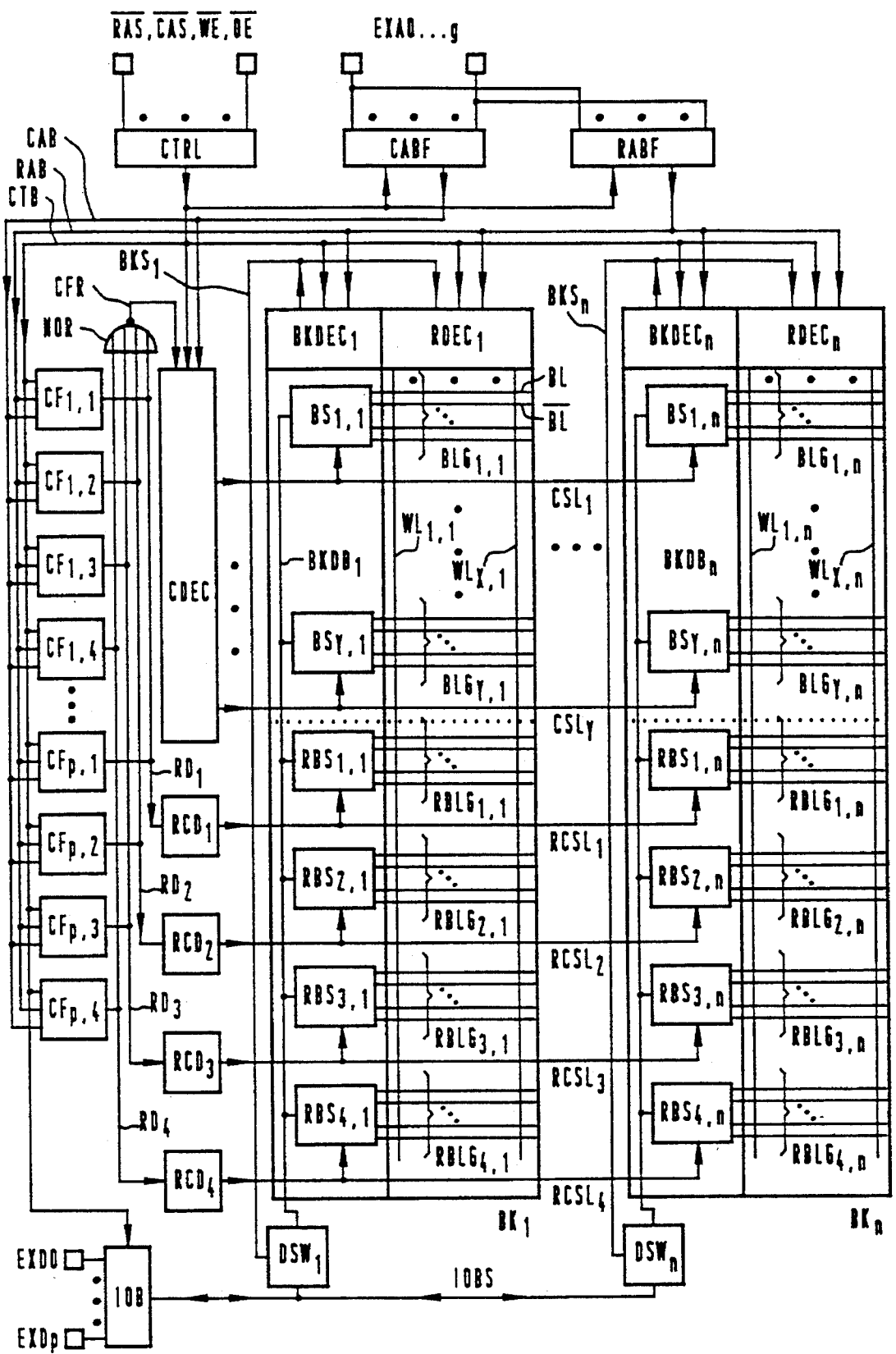
FIG. 4 is a simplified block circuit diagram of a memory according to the invention with variable-block implementation of column redundance.

FIG. 4, as an example of an implementation according to the invention of variable-block column redundance, shows the simplified block circuit diagram of a memory having the same basic organization as in FIG. 1. In a distinction from the former version, each memory block $BK_n$, for instance, contains twice the number of redundance bit line groups $RBLG_{1,n} \ldots _{4,n}$ and bit amplifiers/switches $RBS_{1,n} \ldots _{4,n}$. Correspondingly, the four redundant selection lines $RCSL_1 \ldots 4$ are driven by four redundance drivers $RCD_1 \ldots 4$ that are common to all of the memory blocks. Moreover, the same number of encoding elements $CF_{1,1} \ldots _{P,4}$ as before is used, that is $2 \times n$, but now they are subdivided into four groups each of P=N:2 elements, in which in addition the memory block address can be programmed. The encoding elements receive as their input the first part of the row addresses RAB, which is responsible for the 1 out of N block decoding, and the same column addresses CAB as the column decoder CDEC. Their outputs are switched to four separate lines $RD_1 \ldots 4$, and $CF_1 \ldots _{P,j}$ is switched to $RD_j$, where $j=1 \ldots 4$. These lines are carried to the inputs of the redundant drivers $RCD_1 \ldots 3$ and a quadruple NOR gate NOR. The output of the NOR gate NOR forms the input CFR of the column decoder CDEC. In each cycle, one memory block BKn is activated with a specific row address combination. In the normal case, the lines RD1 ... 4 are inactive, and correspondingly so are the redundant failure lines RCSL1 ... 4. In other words, the control signal CFR is logical "1" and activates the column decoder CDEC. If an addressed memory cell of the bit line group $BLG_{y,n}$ is defective in the memory block BKn, an encoding element CFi,j is programmed for the corresponding block and column addresses. When this block address appears, the encoding element CFi,j programmed for it is selected, and upon application of the corresponding column address, the line $RD_j$ is activated. The control signal CFR, which as a result is inactive, blocks the column decoder CDEC, and the redundant line $RCSL_j$ is driven, instead of the selection line $CSL_y$.

Figure 5:
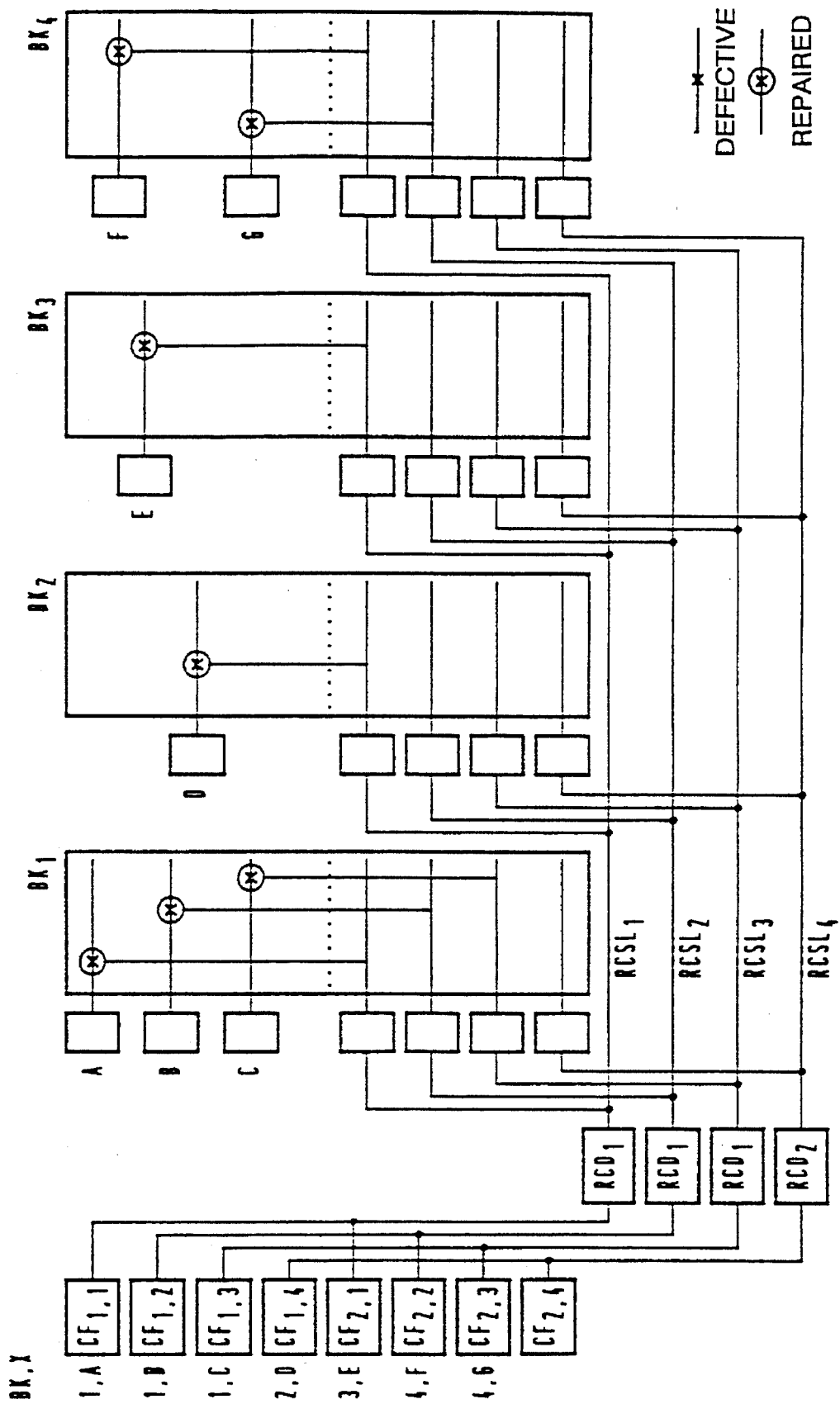
FIG. 5 is a block circuit diagram which shows a simplified repair example with variable-block column redundance in accordance with the present invention.

As in the first version, the total number of possible repairs remains 2×N. However, instead of two permanently defined encoding elements $CF_{i,j}$, in this new version, per memory block, up to four such elements $CF_{i,1} \ldots 4$ are available for repair purposes. As already mentioned at the outset, this results in better utilization. The space required for the redundant bit line groups $BLG_{y,n}$ is just as great as when the column redundance is doubled in the first version. However, since the number of memory blocks $BK_n$ is generally substantially less than the number of selection lines $CSL_y$, only a few supplementary addresses need to be programmable for the modified encoding elements $CF_{i,j}$. Accordingly, the space they require is substantially less than in the case of the requisite doubling of the encoding elements $CF_{i,j}$ for the first version. The use of the variable-block column redundance described is advantageous in all cases where for reasons of space it is no longer possible to increase the conventional redundance. FIG. 5 shows a repair example with variable-block column redundance for the same configuration as in FIG. 2. In this case, it is readily apparent that the memory can be repaired. Identical elements in FIGS. 2 and 5 have the same reference numerals and symbols. In the diagrammatic illustration of FIG. 5, unlike FIG. 2, block-independent encoding elements $CF_{1,1} \ldots CF_{2,4}$, and in this case four redundant drivers $RCD_1 \ldots RCD_4$ are provided in accordance with the invention. Defective memory cells are again symbolically marked with an X and memory cells that have been successfully repaired again are enclosed in a circle.

FIGS. 1 and 4 each show a redundance configuration in which encoding elements $CF_{i,j}$ can be assigned to each active memory block $BK_n$. These encoding elements $CF_{i,j}$ are provided with the same block address bus CAB, RAB, CTB that is responsible for the memory block decoding. However, without changing the fundamental concept of the invention, configurations in which the encoding elements $CF_{i,j}$ are simultaneously assigned to a plurality of memory blocks are also possible. In that case these encoding elements are supplied with merely a subgroup of block addresses. Replacing a defective bit line group takes place in all of these memory blocks simultaneously, regardless of which memory block in fact contains a defect. In this kind of redundance architecture, a memory block $BK_n$ may be imagined as a group of Q individual memory blocks $BK_{n,1} \ldots _Q$, without limitation.

Figure 6:
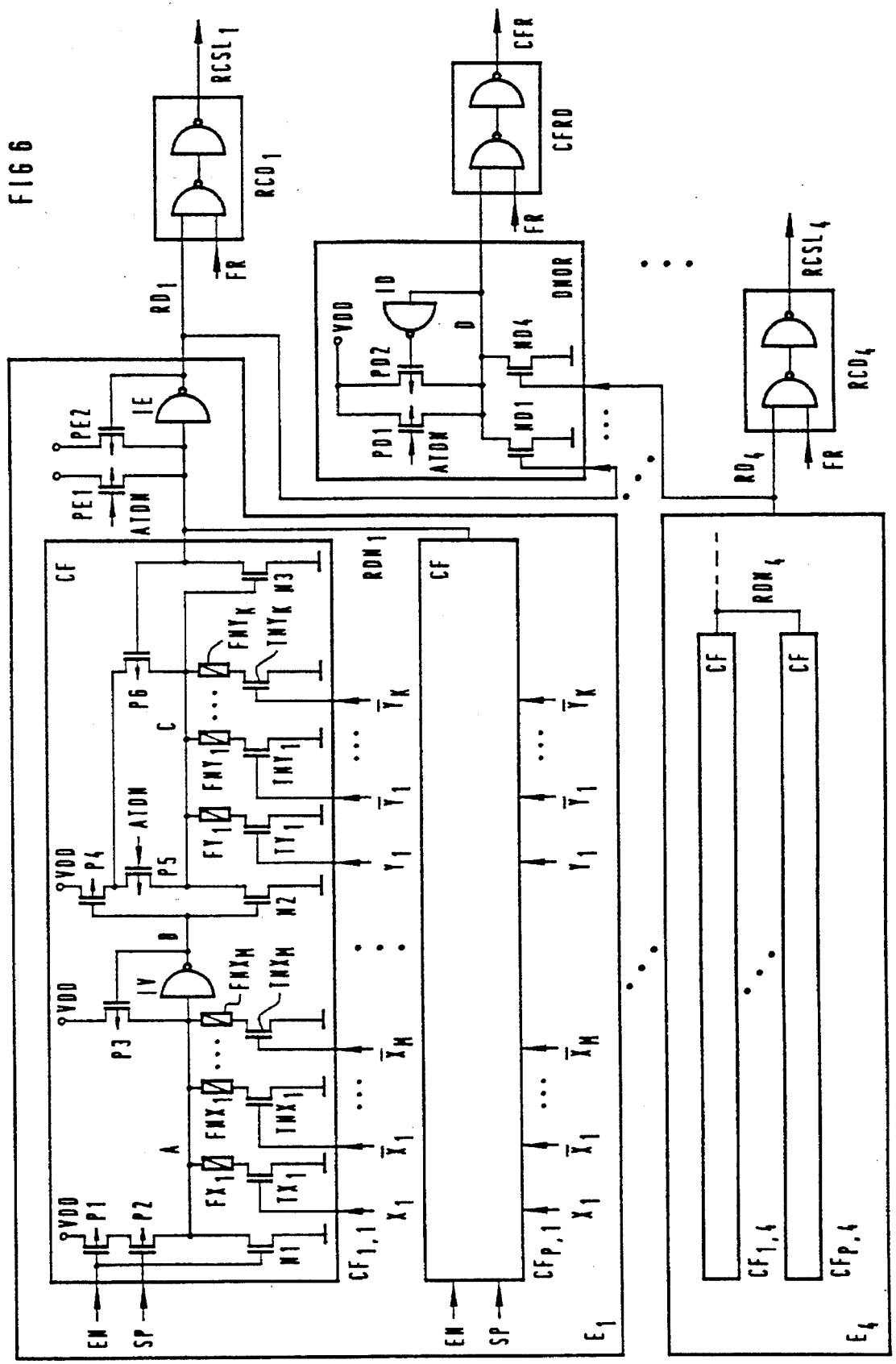
FIG. 6 is a schematic circuit diagram of a configuration of the fuse blocks and triggering thereof with variable-block column redundance according to the present invention.

FIG. 6 shows a circuit configuration according to the invention for encoding the column addresses in variable-block column redundance with fuse blocks as encoding elements. In this version, the total of 2×N encoding elements are subdivided into four identical units Ej, where j=1 . . . 4. One such unit includes P=N/2 encoding circuits $CF_{i,j}$ ($CF_1 \ldots p, 1 \ldots 4$ for $E_{1 \ldots 4}$, where N must be divisible by two), and one inverter IE, together with two p-channel transistors PE1 and PE2. The input of the inverter IE is a line RDNj that is common to all P circuits. The transistors PE1 and PE2 are connected between a high potential (VDD) and this line. The transistor PE1 is a setting transistor with a gate signal ATDN, having a function which is explained below, and the transistor PE2 is a retention transistor. Its gate is connected to the inverter output RDj (j=1 . . . 4) of IE. The four output signals $RD_{1 \ldots 4}$ are each delivered to one redundant driver $RCD_{1 \ldots 4}$ having the outputs $RCSL_{1 \ldots 4}$ and to a dynamic NOR gate DNOR. The output of this gate DNOR is connected to a driver CFRD, having an output which is the signal CFR. The layout and function of these drivers are the same as in FIG. 3.

The circuit DNOR includes two p-channel transistors PD1 and PD2, connected in parallel between the high potential VDD and a node D, four n-channel transistors $ND_{1 \ldots 4}$ connected in parallel between the node D and a low potential VSS, and one inverter ID with an input signal D. A gate of the transistor PD1 is connected to the signal ATDN. An output of the inverter ID is connected to a gate of the transistor PD2 in a retention configuration. The gates of the transistors $ND_{1 \ldots 4}$ are connected to the lines $RD_{1 \ldots 4}$.

Each circuit also has 2×M inputs for the block encoding (N =$2^M$), 2=K inputs for the column encoding (L=$2^k$), two control inputs EN and SP, and the already-mentioned common output $RDN_j$. Such a circuit includes two series-connected p-channel transistors P1 and P2 and one n-channel transistor N1. The enable signal EN is connected to gates of the transistors P1 and N1, and the setting signal SP is connected to a gate of the transistor P2. A common connection A between the transistors P2 and N1 is the input of an inverter IV with a p-channel transistor P3 in a retention configuration. At the node A, 2×M n-channel transistors $TX_1 \ldots _M, TNX_1 \ldots _M$ are also connected in parallel and each is in series with one fuse element $FX_1 \ldots _n, FNX_1 \ldots _M$. The gates of these transistors are connected to the row addresses $X_1 \ldots _M$ and $\bar{X}_1 \ldots _M$, respectively. An output B of the inverter IV is connected to gates of a p-channel transistor P4 and of an n-channel transistor N2. A further p-channel transistor P5 with a gate signal ATDN is also located between these transistors. A common connection C between the transistors N2 and P5 is an input of a "pulled-down" n-channel transistor N3, having a drain output which is connected to the common line $RDN_j$. A final p-channel transistor P6 is connected to the common connection between the transistors P4 and P5 and to the connection C. Its gate is connected to the output line $RDN_j$ in a retention configuration. Finally, at the connection C, 2×K n-channel transistors $TY_1 \ldots _K, TNY_1 \ldots _K$ are each connected in parallel and each is in series with one fuse element $FY_1 \ldots _K, FNY_1 \ldots _K$. The gates of these transistors are connected to the column addresses $Y_1 \ldots _K$ and $\bar{Y}_1 \ldots _K$, respectively.

At this point it should be emphasized that neither the use of the block addresses nor the use of the column addresses signifies any limitation in the type of decoding shown in this case with complementary address lines. Instead, so-called predecoded address lines could also be used, for instance one line of four lines may be active at a time.

The function of the circuit described above will be explained in terms of the timing diagram of FIG. 7, which shows only the necessary memory signals. The first part shows a cycle without the use of column redundance, while the second part shows the activation of this redundance.

In the position of repose ($\overline{RAS}$="1" $\overline{CAS}$="1"), block addresses $X_1 \ldots _M$ and $\bar{X}_1 \ldots _M$, the enable signal FR and the control signal ATDN are in the state of logical "0", while the enable signal EN and the setting signal SP are in the state of logical "1". With the signal EN at high potential, the signals have the following states in all of the circuits $CF_{i,j}$: the signals A logical "0", B logical "1", and C logical "0". Accordingly, all of the n-channel transistors N3 block. With the control signal ATDN at low potential, all of the p-channel transistors PE1 are in the conducting state, and consequently the lines are at the following states: $RDN_j$ logical "1", $RD_j$ logical "0" and $RCSL_j$ logical "0". Since all of the n-channel transistors of the gate DNOR are in the blocked state, the node D, with ATDN="0", is at high potential. However, the enable signal FR is logical "0", so that the signal CFR is likewise at low potential. In other words, the bit decoder is locked.

A writing or reading cycle is initiated by the trailing edge of the signal $\overline{RAS}$ and the externally applied row addresses are stored in memory. Shortly thereafter, a certain combination of M lines among the 2×M block address lines $X_i$ and $\bar{X}_i$ become active, logical "1". The enable signal EN, which also is used in other ways in the memory, becomes logical "0". In all of the circuits $CF_{i,j}$, the transistor P1 thereby becomes conducting. The transistor N1, conversely, is blocked. With a slight delay T1, after which all of the active block address lines have assumed a stable logical state, the setting signal SP becomes logical "0" for the duration T2 (amounting to a few nanoseconds). During this time T2, both transistors P1 and P2 are conducting. As a result, a charging current can flow from the high potential VDD to the node A. If for a circuit $CF_{i,j}$ (first part of the timing diagram of FIG. 7), at least in an n-channel transistor with a non-separated fuse element, the block address is logical "1", then the node A as a result of this conductive connection is kept at such a low potential that the output B of the inverter IV remains logical "1". As a result, the common connection C is logical "0" and the N-channel transistor N3 is blocked. Since the transistor P4, with B="1" is also blocked, the transistors P5 and P6 do not play any role. In this state, the circuit $CF_{i,j}$ is accordingly inactive.

A small quadrature-access current component flows during the period T2 from the high potential VDD through the transistors P1 and P2, and in the worst case through half of all of the n-channel transistors with non-separated fuse elements, toward the low potential VSS. However this current, which appears when the memory in all of the circuits $CF_{i,j}$ are completely error-free, can be kept extremely slight by means of the dimensioning of the transistors P1 and P2 and by means of a minimum time period T2. This above all exploits the circumstance that for DRAM memories, a relatively long period of time is available for block decoding of the column redundance. The input part of the circuit $CF_{i,j}$ which is responsible for this block decoding, therefore need not have an especially high speed. In the event that all of the circuits $CF_{i,j}$ of one unit $E_j$ are inactive, all of the transistors N3 block. Due to the turned-on p-channel transistor PE1 (ATDN="0"), the line $RDN_j$ is then logical "1", and consequently the output line $RDC_j$ and the redundant selection line $RCSL_j$ are logical "0". If, as is explained below, the control signal ATDN rises to high potential, the state of logical "1" of the line $RDN_j$ is maintained by the turned-on retention transistors PE2 with the gate at logical "0". If all of the lines $RD_j$ have the state of logical "0", as is assumed in the first part of FIG. 7, then all of the redundant selection lines $RCSL_{1...4}$ are inactive at logical "0", and all four n-channel transistors $ND_{1...4}$ of the gate DNOR are blocked. The node D, even with the control signal ATDN in the state of logical "1", remains logical "1" because of the turned-on p-channel retention transistor PD2.

With the leading edge of the enable signal FR, the signal CFR consequently becomes logical "1", and the column decoder CDEC is enabled. With the trailing $\overline{CAS}$ edge, the externally applied column addresses are stored in the memory CABF, which previously was transparent to these addresses. A normal selection line CSL becomes active, and the corresponding bit line group of whichever memory block is active at that moment is selected.

Figure 7:
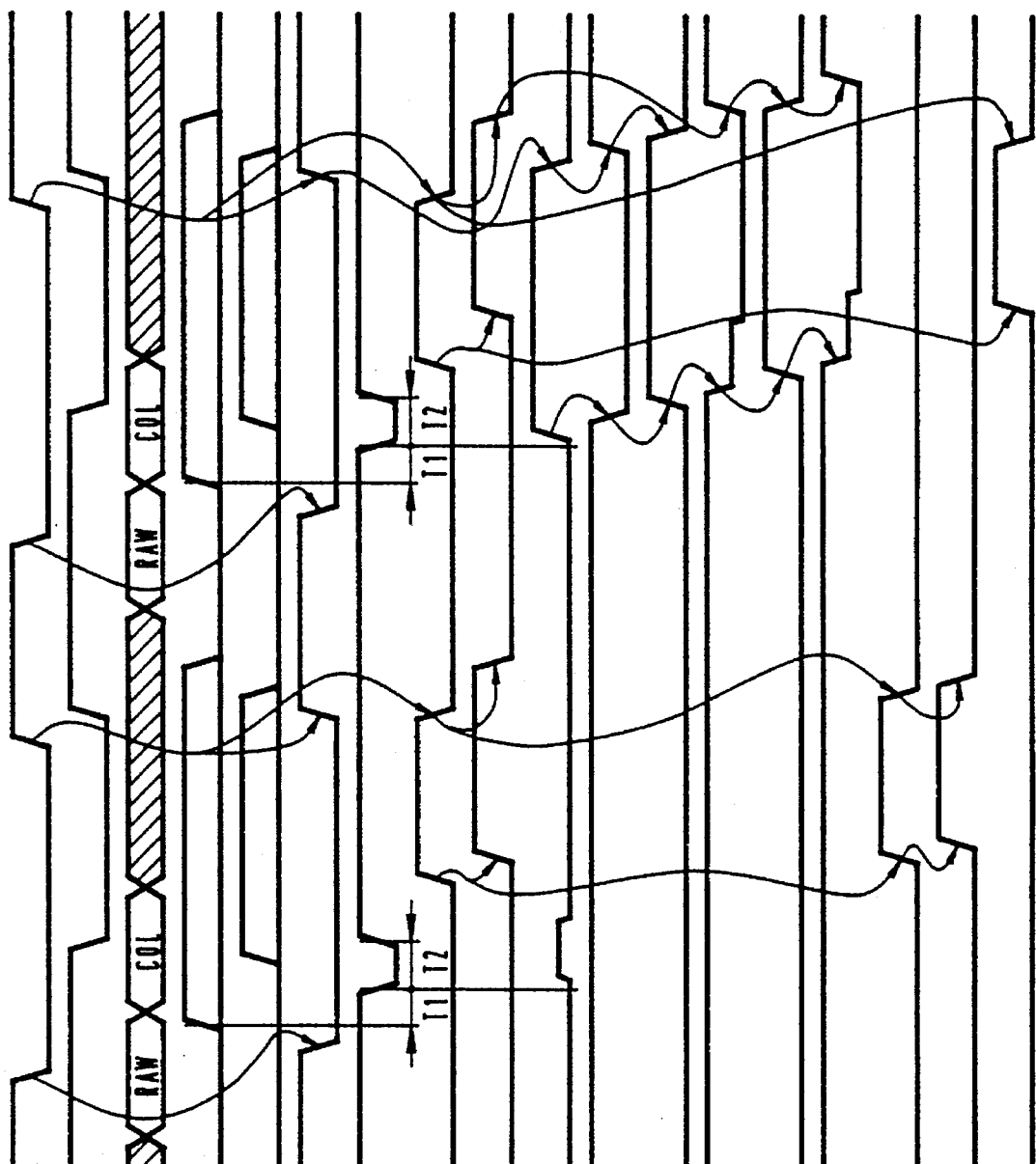
FIG. 7 is a timing diagram for signals of FIG. 6.

The first writing or reading cycle of FIG. 7 is terminated by the leading $\overline{RAS}$ edge, which resets the signal EN to high potential and the signal FR to low potential. In the ensuing interval of repose, as already explained, all of the circuits $CF_{i,j}$ and the redundant selection lines $RCSL_{1...4}$ are inactive as a result of the signal EN and the enable signal FR, respectively. The bit decoder is locked with the signal CFR=logical "0".

The second part of the timing diagram of FIG. 7 shows a redundance situation. The beginning of a writing or reading cycle proceeds as in the first part. If for one circuit $CF_{i,j}$ in an arbitrary unit $E_j$, all of the fuse elements in which the associated block addresses assume the value of logical "1" have been separated, then the node A rises to high potential because of the turned-on p-channel transistors P1 and P2. The output B of the inverter IV becomes logical "0" and turns on the retention transistor P3. The state of logical "1" for A therefore continues to be preserved after the time T2 has elapsed (SP is again logical "1"). In this state, the circuit $CF_{i,j}$ is selected. Naturally only one such circuit is allowed to be active in each unit $E_j$. The transistors P4 and P5 are turned on by the output B and the signal ATDN (both at logical "0"), respectively, while conversely the transistor N2 is turned off. As a result, a charging current of high potential VDD can flow to the node C. If for this circuit $CF_{i,j}$ all of the fuse elements in which the associated column addresses are logical "1" have been separated, then the node C rises to high potential. This turns on the n-channel transistor N3. This transistor is dimensioned in such a way that the line $RDN_j$ of the applicable unit $E_j$ is discharged to a low potential close to VSS, even though initially the p-channel transistors PE1 and PE2 are still conducting. With a low potential on this line, the transistor P6 of the circuit $CF_{i,j}$ is turned on, and the output of the inverter IE is switched to the state of logical "1". As a result the retention transistor PE2 becomes non-conducting. The potential of $RDN_j$ can decrease even further. With a certain delay after which the column addresses will have become stable, or once the enable signal FR has risen to high potential, the control signal ATDN becomes logical "1". Then the transistor PE1 is turned off as well, and the line $RDN_j$ drops to the low potential VSS (logical "0"). Even though the transistor P5 is then turned off as well, the node C, because of the turned-on transistors P4 and P6, remains logical "1". In this state, in contrast to the version of FIG. 5, no quadrature-axis current component flows in the circuit $CF_{i,j}$.

As soon as the output $RD_j$ of the inverter IE assumes the state of logical "1", the corresponding n-channel transistor $Nd_j$ of the gate DNOR also becomes conducting. The potential of the node D also falls far enough to ensure that the signal CFR becomes logical "0", regardless of the enable signal FR. This locks the column decoder. Conversely, with the leading edge of the enable signal FR, the corresponding redundant selection line $RCSL_j$ becomes active. Naturally, various column addresses are programmed for whichever circuit $CF_{i,j}$ of the units $E_j$ is active, so that only one of the lines $RCSL_j$ will be selected at a time. The status described continues until with a leading $\overline{CAS}$ edge ATDN again becomes logical "0", and new column addresses are adopted, or until the resting interval is initiated with the leading $\overline{RAS}$ edge.

Finally, the function will be described for the case where in the active circuit $CF_{i,j}$ of a unit $E_j$ the column addresses applied have not been programmed (not shown in FIG. 7). If at least in an n-channel transistor with a non-separated fuse element, the column address is logical "1", the node C as a result of this conductive connection is kept at such a low potential that the n-channel transistor N3 blocks. Since all of the other circuits of the unit $E_j$ are inactive (C=logical "0"; N3 is blocked), the corresponding line $RDN_j$, as a result of the turned-on transistors PE1 and PE2 (ATDN=logical "0"), will remain logical "1", or upon an address change it will be charged to high potential. Therefore the output $RD_j$ of the inverter IE is logical "0", and the corresponding n-channel transistor of DNOR is turned off. The redundant selection line $RCSL_j$ (logical "0") is independent of the signal FR. This state is preserved even after the leading ATDN edge by means of column addresses themselves. In the circuit $CF_{i,j}$, no quadrature access component of current then flows. In the event that the programmed column addresses do not match the column addresses applied for any circuit $CF_{i,j}$ of the active units $E_j$, then all of the lines $RD_{1...4}$ are logical "0", and all of the transistors $ND_{1...4}$ are turned off. As already explained above, the column decoder is then enabled by the signal FR, by means of CFR="1".

The main advantage of the version shown in FIGS. 4 and 6 is the better utilization of the encoding elements and the little amount of space required. An advantage of the circuit shown in FIG. 6 is the reduction of power consumption by approximately 70% as compared with a conventional version, as a result of the use of the ATDN pulse. However, since this is not a component of the invention, the generation of this signal, which is coupled to the enable signal FR and plays a role in the so-called fast-page mode when the column addresses are changed, will not be described in further detail herein. One further advantage of this circuit in specific implementations is the use of only one line $RDN_j$ with pull-down transistors N3 in the units $E_j$.

Figure 8:
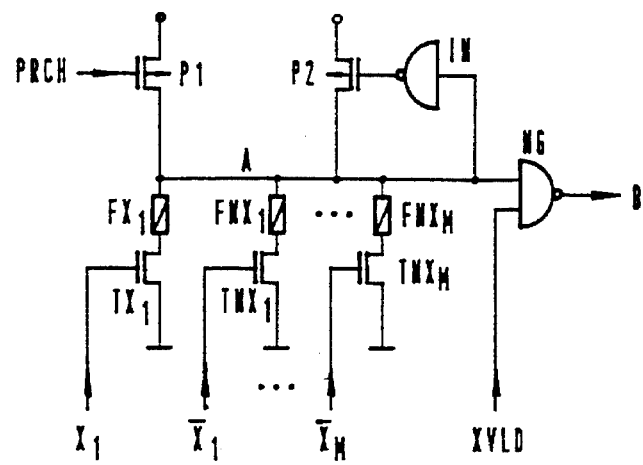
FIG. 8 is a schematic circuit diagram of a further embodiment of the fuse blocks and triggering thereof with variable-block column redundance.

FIG. 8 shows a variant of the block decoding for the encoding circuit CF. An advantage of this encoding circuit is that no quadrature-access current component flows during the selection. One additional NAND gate is needed therefor. The circuit includes two p-channel transistors P1 and P2, an inverter IN, a NAND gate NG, and the same n-channel transistors $TX_1 ... TX_M$ with fuse elements $TX_1 ... FNX_M$ as in FIG. 6. The transistors P1 and PT2 are connected between the high potential VDD and the node A. A signal PRCH and an output of the inverter IN are carried at the respective gates of the transistors P1 and P2. An input of the inverter IN, a first input of the NAND gate NG, and the parallel-connected encoding elements are connected to the node A. A signal XVLD is carried at a second input of the NAND gate NG, having an output which is the signal B mentioned above.

Figure 9:
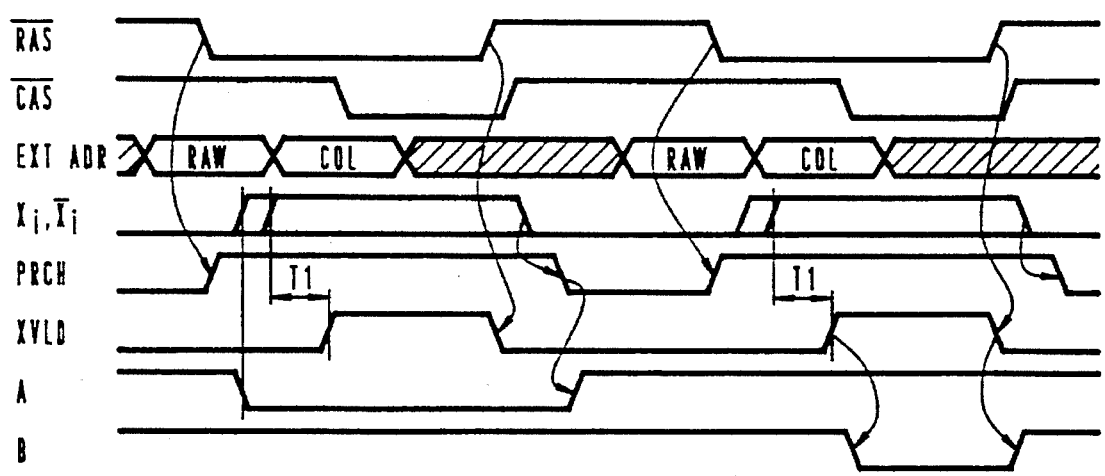
FIG. 9 is a timing diagram for signals of FIG. 8.

FIG. 9 shows a timing diagram for the signals being used, in order to explain the function of this circuit. During the resting interval ($\overline{RAS}$="1"), the signals PRCH, XVLD, and the block addresses $X_i$, $\overline{X}_i$, where i=1...M, are logical "0".

In this state, all of the n-channel transistors are blocked, and the p-channel transistor P1 is conducting. Accordingly, the node A is logical "1" and the inverter output is logical "0". As a result, the transistor P2 is likewise conducting. The output B of the NAND gate NG is logical "1", because the signal XVLD has the state of logical "0". As already explained, this deactivates the column encoding part.

In a writing or reading cycle, the signal PRCH after the trailing $\overline{RAS}$ edge becomes logical "1". The state of logical "1" of the node A is preserved as a result of the turned-on transistor P2. Once the row addresses have been stored in memory, the node A remains logical "1" in the case of a block selection, because the fuse elements with block addresses are separate in the logical "1" state. Otherwise, it is discharged by a conductive connection to VSS, and the inverter turns off the p-channel transistor P2. It is only after a delay T1, after which the block addresses have become stable, that the level of the signal XVLD rises. As a result, in a block selection, the output B becomes logical "0", and the following circuit is turned on as in FIG. 6. If the applied block addresses are not programmed, the signal B remains logical "1".

At the end of a cycle, the signal XVLD drops to low potential with the trailing $\overline{RAS}$ edge. The signal B becomes logical "1", and the column encoding of the circuit CF is turned off. The block addresses are then reset (logical "0"), followed by the signal PRCH. The node A therefore rises to high potential again. The advantage of the circuit is that no quadrature-axis component of current flows through the transistor P1 if the applied block addresses have not been programmed.

FIG. 10 shows a circuit for generating the setting pulse SP of FIG. 6 and an additional circuit for forming the signal XVLD of FIG. 8. A first circuit includes two p-channel transistors P1 and P2, an inverter I1, an inverting delay element VG, a NAND gate NG1, and in this example three pairs of n-channel transistors 1 ... 6. The transistors P1 and P2 are connected in parallel between the potential VDD and the node A. The signal PRCH is connected to the gate of the transistor P1. The n-channel transistors 1 ... 6 being connected parallel in pairs and having gate signals $X_i$ and $\bar{X}_i$, where i=1 ... 3, are disposed serially between the node A and the low potential VSS. The node A is the input of the inverter I1. The output B of this inverter I1 is connected to the gate of the transistor P2, to a first input of the NAND gate NG1, and to an input of the delay element VG. An output C of this element is a second input of the NAND gate NG1 with an output signal SP. The delay element VG includes an odd number of series-connected inverters I2, I3, I4 with delay capacitors C1, C2, in a known connection mode. In this example, three inverters and two capacitors are shown.

In the circuit for generating the signal XVLD shown in FIG. 11, the NAND gate NG1 and the delay element VG are replaced by a NAND gate NG2 and a following inverter 15 having an output signal XVLD. Inputs of the NAND gate NG2 are signals RINT and B.

A timing diagram of the signals mentioned above is shown in FIG. 12. The signal RINT, which is used for other purposes in the memory, is a pulse that is inverted with respect to the external $\overline{RAS}$ signal. In the resting interval ($\overline{RAS}$="1"), RINT, PRCH and all of the block addresses $X_i$ and $\bar{X}_i$ are logical "0". In this state, all of the n-channel transistors between the node A and the potential VSS are blocked, while the transistor P1 conversely is conducting. As a result, A is at high potential and B is at low potential. The transistor P2 is turned on. With the signal B in the state of logical "0", the outputs SP and C of the NAND gate NG1 and the delay element VG are logical "1". Conversely, the signal XVLD is logical "0". With the trailing $\overline{RAS}$ edge, PRCH rises to high potential. The state of logical "1" of A is initially preserved as a result of the turned-on transistor P2, even through the transistor P1 is then blocked. Once the external row addresses have been stored in memory, one or the other signal becomes active at logical "1" for each pair of signals $X_i$ and $\bar{X}_i$, depending on the address combination. As soon as all of the block addresses having this logical state have been applied, the node A drops to low potential through the resultant conductive path toward the potential VSS. As a result, the output B of the inverter IV becomes logical "1", and the transistor P2 is turned off. Since the transistors P1 and P2 are then blocked, no quadrature-axis current component flows toward the potential VSS. This state is preserved by the block addresses $X_i$ and $\bar{X}_i$ themselves. With a certain delay T1, after which the slowest block address $X_i$ or $\bar{X}_1$ has become logical "1", the signal SP becomes logical "0", since the signals B and C are both at high potential. However, the leading edge of B is inverted by the delay element VG after a delay period T2. The signal C accordingly becomes logical "0" after this time period, and the output SP of the NAND gate NG1 as a result becomes logical "1" again. In the additional circuit for generating the signal XVLD, this signal after a delay period T1', after which all of the block addresses will have becomes stable, becomes logical "1" by means of the leading edge of the signal B, since the signal RINT in this time range is logical "1".

At the end of an active cycle, with the leading $\overline{RAS}$ edge, the signals RINT, $X_i$, $\bar{X}_i$ and PRCH in succession become logical "0". The conductive connection between the node A and the potential VSS is cancelled Since PRCH equals "0", the node A becomes logical "1" through P1, and the signal B becomes logical "0". The output C of the delay element VG, with a delay, becomes logical "1". Since after the setting pulse SP, either the output C or B is logical "0", then the setting pulse SP also remains logical "1". The signal XVLD is turned off shortly after the leading $\overline{RAS}$ edge by means of RINT="0".

We claim:

1. A column redundant circuit configuration for a memory, comprising:

a plurality of N memory blocks each having memory cells disposed in x lines and y columns, and memory cells disposed in c redundant columns;

respective ones of said memory cells being addressed via a block address, a line address and a column address;

a column decoder decoding a respective one of said columns with a column address impressed thereon;

a plurality M of encoding elements allowing a repair of M defective memory cells per memory;

a plurality M/c of said encoding elements being assigned to each of said c redundant columns; and each of said encoding elements having programmable block address decoding means and programmable column address decoding means.

2. The column redundant circuit configuration according to claim 1, wherein the number d of said encoding elements is less than the product of the number N of said memory blocks and the number of said redundant column decoders.

3. The column redundant circuit configuration according to claim 1, including a NOR gate with c inputs and an output, said column decoder having an activating input, said encoding elements being subdivided into c groups and having outputs, the inputs of said NOR gate being connected to the outputs of said encoding elements, and the output of said NOR gate being connected to the activating input of said column decoder.

4. The column redundant circuit configuration according to claim 1, wherein one of said memory blocks includes a number of individual memory blocks, and all of said individual memory blocks have redundant column lines for simultaneously replacing various column lines to be replaced.

5. The column redundant circuit configuration according to claim 1, wherein said address decoding means contain separate means for decoding a memory block address and a column address.

6. The column redundant circuit configuration according to claim 5, wherein said means for decoding the memory block address are connected in series with said means for decoding the column address.

7. The column redundant circuit configuration according to claim 5, wherein said means for decoding the memory block address and the column address have a number of parallel-connected series circuits of separable fuse elements and field effect transistors having load paths being connected between a node point and ground and having control inputs receiving address signals, a holding stage having an input terminal being connected to the node point and having an output terminal outputting a first decoding signal, and an activating stage, having an output connected to the node point.

8. The column redundant circuit configuration according to claim 7, wherein said activating stage contains first and second field effect transistors of a first conduction type and one field effect transistor of a second conduction type having load paths being connected in series between a supply potential and ground, said field effect transistor of the second conduction type being connected to ground and having a control terminal, said first field effect transistor of the first conduction type being connected to the supply potential and having a control terminal being connected to the control terminal of said field effect transistor of the second conduction type and being supplied with a first control signal, said second field effect transistor of the first conduction type having a control terminal receiving a further control signal, and said series circuit of the load paths of said second field effect transistor of the first conduction type and of said field effect transistor of the second conduction type being connected at an output node at which an output signal is present.

9. The column redundant circuit configuration according to claim 5, wherein said address decoding means are constructed as a dynamic circuit configuration.

10. The column redundant circuit configuration according to claim 9, wherein said means for decoding the memory block address and the column address have a number of parallel-connected series circuits of separable fuse elements, field effect transistors having load paths being connected between a node point and ground, said field effect transistors having control inputs receiving address signals, a precharging transistor having a load path being connected between a supply voltage terminal and the node point, a dynamic holding stage being connected to the node point, and a logic gate having an input terminal being connected to the node point and an output terminal at which the output signal of said decoding means is present.

* * * * *